US009099506B2

(12) United States Patent
Haris (10) Patent No.: US 9,099,506 B2
(45) Date of Patent: Aug. 4, 2015

(54) TRANSFER CHAMBER BETWEEN WORKSTATIONS

(75) Inventor: Clinton M. Haris, Lunenburg, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 1418 days.

(21) Appl. No.: 11/093,480

(22) Filed: Mar. 30, 2005

(65) Prior Publication Data

US 2006/0245847 A1 Nov. 2, 2006

(51) Int. Cl.
*H01L 21/677* (2006.01)
*H01L 21/67* (2006.01)

(52) U.S. Cl.
CPC .... *H01L 21/67196* (2013.01); *H01L 21/67184* (2013.01); *H01L 21/67715* (2013.01); *Y10S 414/135* (2013.01); *Y10S 414/139* (2013.01)

(58) Field of Classification Search
USPC .......................................................... 414/217
See application file for complete search history.

(56) References Cited

U.S. PATENT DOCUMENTS

| 5,310,410 | A * | 5/1994 | Begin et al. ................... 29/25.01 |
| 5,571,325 | A | 11/1996 | Ueyama et al. |
| 5,695,564 | A * | 12/1997 | Imahashi ....................... 118/719 |
| 6,038,490 | A * | 3/2000 | Dimitri et al. ................. 700/214 |
| 6,235,634 | B1 * | 5/2001 | White et al. .................... 438/680 |
| 6,280,134 | B1 * | 8/2001 | Nering ........................... 414/217 |
| 6,503,365 | B1 | 1/2003 | Kim et al. |
| 6,540,869 | B2 * | 4/2003 | Saeki et al. ................. 156/345.31 |
| 6,852,194 | B2 | 2/2005 | Matsushita et al. |
| 6,985,794 | B1 * | 1/2006 | Conboy et al. ................. 700/214 |
| 7,198,448 | B2 * | 4/2007 | Ozawa et al. .................. 414/217 |
| 7,231,278 | B2 * | 6/2007 | Ngo .............................. 700/213 |
| 7,258,768 | B2 * | 8/2007 | Yamazaki ................. 204/298.25 |
| 2003/0180126 | A1 | 9/2003 | Poole |
| 2004/0105737 | A1 * | 6/2004 | Ozawa et al. .................. 414/217 |
| 2008/0095047 | A1 * | 4/2008 | Skalecki et al. ............... 370/225 |

FOREIGN PATENT DOCUMENTS

| JP | 04-298059 | 10/1992 |
| JP | 08-151552 | 5/1994 |
| JP | 08-111449 | 4/1996 |
| JP | 09-306971 | 11/1997 |
| JP | 11-307614 | 11/1999 |
| JP | 2000-150618 | 5/2000 |
| JP | 2000-312463 | 11/2000 |
| JP | 2001-053131 | 2/2001 |
| JP | 2001315960 | 11/2001 |
| WO | WO2004/010476 | 1/1994 |

OTHER PUBLICATIONS

International Search Report, International Application No. PCT/US06/11461, dated Aug. 29, 2007, (1 page).

* cited by examiner

*Primary Examiner* — Scott Lowe (74) *Attorney, Agent, or Firm* — Perman & Green, LLP; Colin C. Durham (57) ABSTRACT

A bridging chamber is constructed between adjacent substrate processing workstation systems and connected by ports constructed in the adjacent substrate processing workstation systems. Transport mechanisms are used to move the substrates into and out of the bridging chamber to bypass primary transport systems.

13 Claims, 6 Drawing Sheets

TRANSFER CHAMBER BETWEEN WORKSTATIONS

BACKGROUND OF THE INVENTION

1. Field of the Invention

This invention relates to a mechanism for transporting substrates. More particularly a transfer chamber is provided by which substrates may be transferred from one processing workstation system to an adjacent processing workstation system.

2. Brief Description of Related Developments

The processing of semiconductors often involves multiple process steps such as the deposit of a film on a substrate by chemical vapor deposition (CVD), the photo etching of the film, as well as heating, cooling and cleaning.

Such process operations may be performed under vacuum in specialized process chambers. Generally multiple process chambers are grouped in association with substrate handling mechanism to form a workstation system. Depending on the nature of each process, either batch processing of semiconductor substrates or individual substrate processing is used.

In batch processing, a cluster of processing chambers are arranged to form a workstation system. The processing chambers are positioned around a substrate transport chamber, constructed to be kept under a controlled atmosphere or vacuum. One or more load lock chambers are connected through slit valves to the transport chamber and act as a transfer station between ambient atmosphere and processing atmosphere.

A robotic transport mechanism, generally in the form of a robot is mounted within the transport chamber and operates to remove substrates from the load lock and deliver them to the selected process chambers. After processing, the substrates are picked up by the robot and transported to the next process chamber or to a load lock for removal from the transport chamber.

A system of this type is described in U.S. Pat. No. 5,882,413 and an example of a robotic transfer mechanism is shown in U.S. Pat. No. 5,647,724, each of which is assigned to an owner common to this application. The disclosures of these patents are incorporated herein by reference in their entirety.

It has been found that substrates up to 200 mm in diameter can be effectively processed with the cluster type workstation systems. However, there is a trend towards increasing diameters and the cluster systems become unduly large when processing substrates of 300 mm or more in diameter. In some circumstances, there is a need to provide a more compact process handling module, which is capable of being installed in a side by side relation within a small footprint of space. In addition there is a need for system modules which are more adaptable to the wide variety of process chambers and front end delivery transports. A system of this type is described in commonly owned Application for patent Ser. No. 09/897,202 filed Jul. 2, 2001. Such systems employ a front end loader which may be connected to the load locks of a pair of processing chambers situated side by side. A robot may be mounted within the front end loader to extract substrates for processing from cassettes. The robot may be mounted on a track to shuttle from one load lock to the other as shown in U.S. Pat. No. 6,002,840.

Regardless of the type of system (i.e. batch or individual processing) employed in a fabrication facility, (but generally more so in the case of batch processing) a substrate may be conventionally transported in cassettes from workstation systems to other workstation systems in a production sequence by automated material handling systems such as, overhead hoist transports, automated guided vehicles, rail guided vehicles or operators. Hence the bandwidth (i.e. capacity and rate) of the automated material handling system becomes a factor effecting the through put of a workstation system in the fabrication facility, and consequently effecting the through put of the whole facility. For example, in order for substrates to be transferred in conventional systems the substrates are placed in cassettes by a particular workstation and removed from the front end loader of the particular workstation system and placed on the related transport for delivery to the next workstation system. This creates increased risk of contamination and significantly lost time.

High throughput transport devices designed to move a substrate or workpiece between remote locations within areas having a limited footprint are in high demand. The desire to move a workpiece from one position to the next, involves not only a high throughput rate, but also repeatable accurate placement of workpieces registered in a predetermined orientation on a supporting surface.

The exemplary embodiments described below incorporating features of the invention provide a means for bypassing the cassette or other automated transport system when it is desired to sequentially process substrates in processing chambers of adjacent workstation systems thereby increasing throughput compared to conventional systems as will be further described. Further, the exemplary embodiments incorporate alignment and metrology measurement functions as part of the bypass transfer for further increases in throughput without affecting footprint constraints.

SUMMARY OF THE EXEMPLARY EMBODIMENTS

According to one exemplary embodiment of this invention, a bridging, chamber is constructed between adjacent substrate processing workstation systems and connected by valves to ports constructed in the front end load systems of adjacent workstation systems. The front end load stations each employ robotic transfer mechanisms which are capable of extending from the front end load station into the bridging chamber. A buffer platform is constructed within the bridging chamber to receive a substrate from one front end robot and hold it for pick up by the front end robot of the adjacent workstation system.

According to another exemplary embodiment of this invention, the bridging chamber is constructed with appropriate valves for opening and closing input and output ports constructed in the bridging chamber. The bridging chamber of this embodiment is further provided with an atmosphere adjustment system for accommodating different operating atmospheres of adjacent workstation systems.

BRIEF DESCRIPTION OF THE DRAWINGS

The foregoing aspects and other features of the exemplary embodiments are described in more detail below with reference to the attached drawing in which.

DETAILED DESCRIPTION OF THE EXEMPLARY EMBODIMENTS

Figure 1:
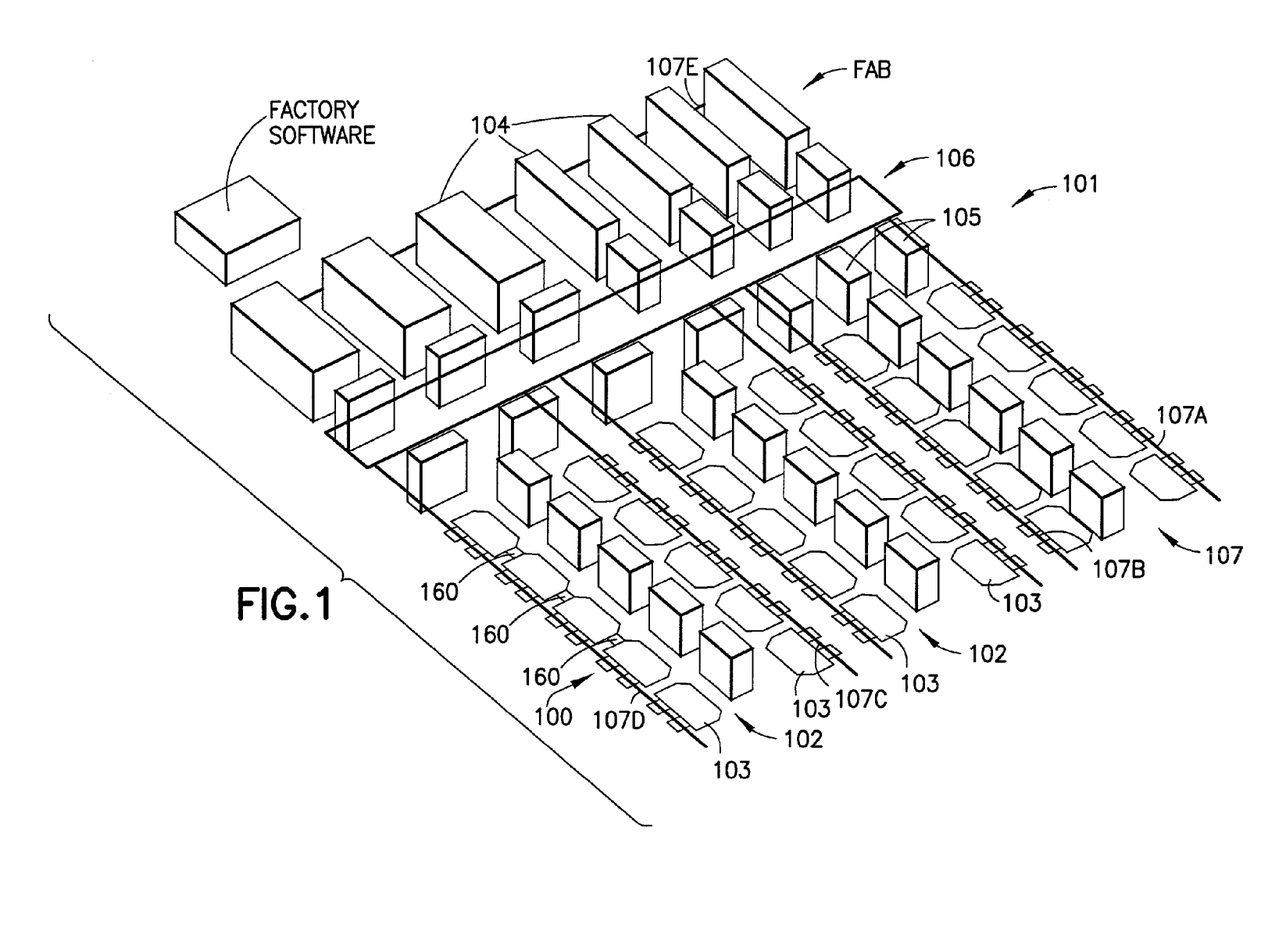
FIG. 1 is a schematic perspective view of a fabrication facility with work station systems incorporating features of the present invention arranged in the fabrication facility and an automated material handling system 106 linking the work station systems.

Referring to FIG. 1, there is shown a schematic illustration of a fabrication facility FAB with apparatus 100 incorporating features of the present invention. Although the present invention will be described with reference to the embodiments shown in the drawings, it should be understood that the present invention can be embodied in many different alternate forms of embodiments. In addition, any suitable size, shape or type of elements or materials could be used.

The exemplary embodiments described below relate generally to material transfer devices. The material transferred might include but is not limited to 200 mm or 300 mm semiconductor wafers, such as silicone and gallium arsenide, semiconductor packaging substrates such as high density interconnects HDI, semiconductor manufacturing processing imaging plates, such as masks or recticles, and large area display panels, such as activate matrix LCD substrates. Throughout this application the term substrate will be used to refer to such devices in their broadest sense.

Still referring to FIG. 1, and as noted above, the fabrication facility FAB has processing apparatus 100 and automated material handling system 106, 107. In FIG. 1, the facility FAB is shown for example purposes as also having other stations such as stockers 105, and sorters or other processing facilities 104. The processing apparatus 100, as well as the other station 104, 105 may be arranged in any desired manner, though stations 100, 104, 105 are illustrated in FIG. 1 as being arranged in bays having a general grid pattern for example purposes only. The automated material handling system 106, 107 is arranged (such as for example in interbay 106 and intrabay 107A-107D portions) to connect or link any desired number of apparatus 100 to each other and to the other stations 104, 105 so that transport (in the case of semiconductor processing such as FOUP, or SMIF or any other desired configuration) containers may be transported from any desired apparatus 100 or station 104, 105 to any other desired apparatus or station. The automated material handling system (AMHS) may be any suitable type of handling system (e.g. overhead rail transport, automated guided vehicles, ground rail transport) capable of moving the desired transport containers. The AMHS may be capable of interfacing directly with (i.e. picking and placing containers on) the interface portion of apparatus 100. An example of a suitable AMHS system is the AEROTRACK™ system from Brooks Automation, Inc. Each apparatus 100 generally includes multiple workstations 103. One or more of the workstations 103 of the apparatus 100 may be able to interface directly with the AMHS 107 so that containers may be placed or picked by the AMHS system directly from workstations 103. As will be described in greater detail below, each apparatus also has transfer chambers 160 communicating between adjacent workstations 103 of the apparatus 100. The transfer chambers 160 form a bypass to the AMHS system 107 between workstations.

Figure 2:
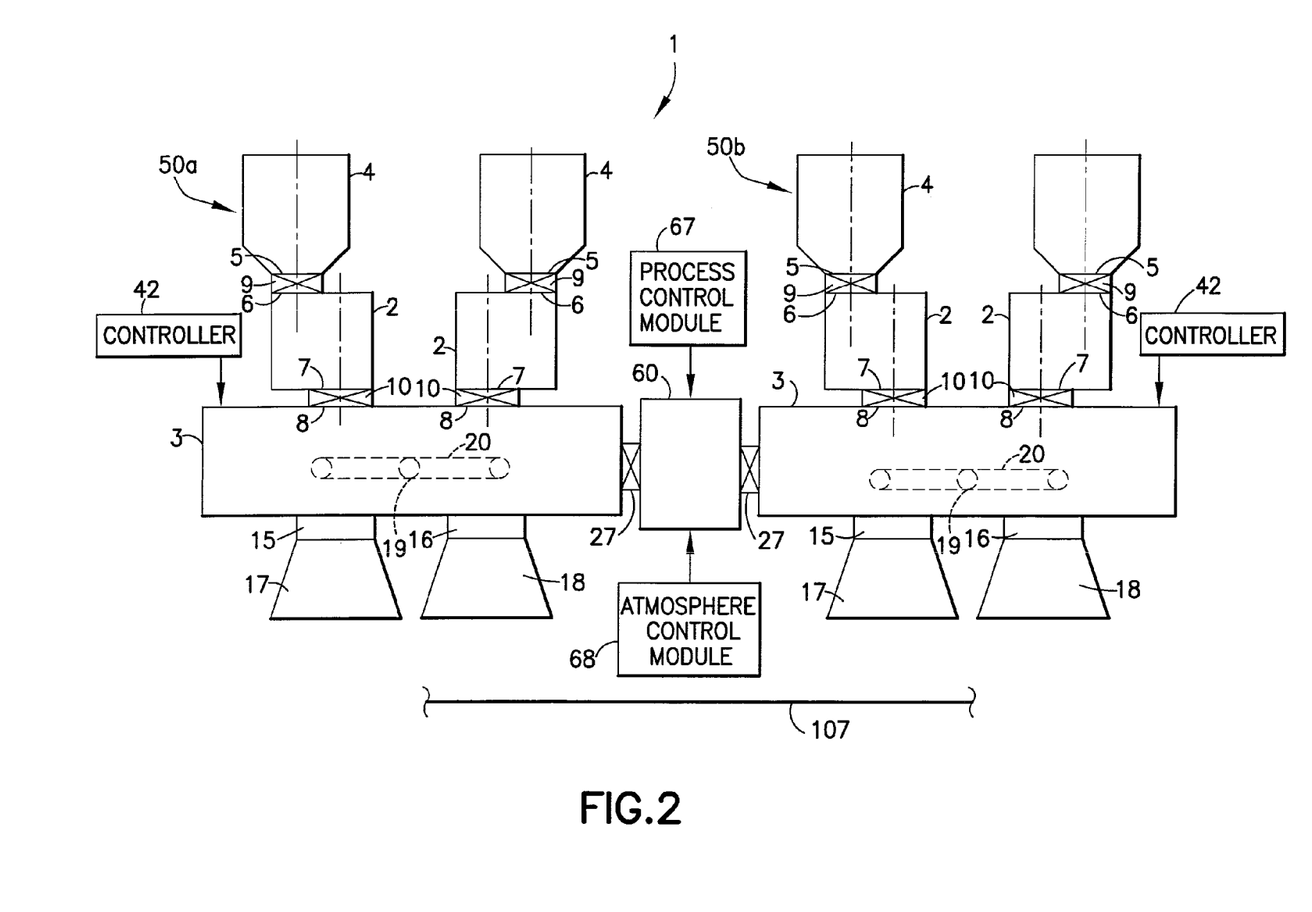
FIG. 2 is a schematic illustration of a pair of adjacent workstation systems with side by side processing chambers, connected by a bridging chamber according to this invention.

Referring now to FIG. 2, there is shown an apparatus 1 that is substantially similar to apparatus 100 in FIG. 1. The apparatus 1 in FIG. 2 is an exemplary embodiment and generally consists of a pair of workstations 50a and 50b each having like elements. Only workstation system 50a will be described in the following and it should be assumed unless otherwise indicated that the workstation systems 50a and 50b are similar. It should be noted that it is not desired that the workstation systems be similar and this invention is adaptable to connecting workstation systems of different types.

Figure 4:
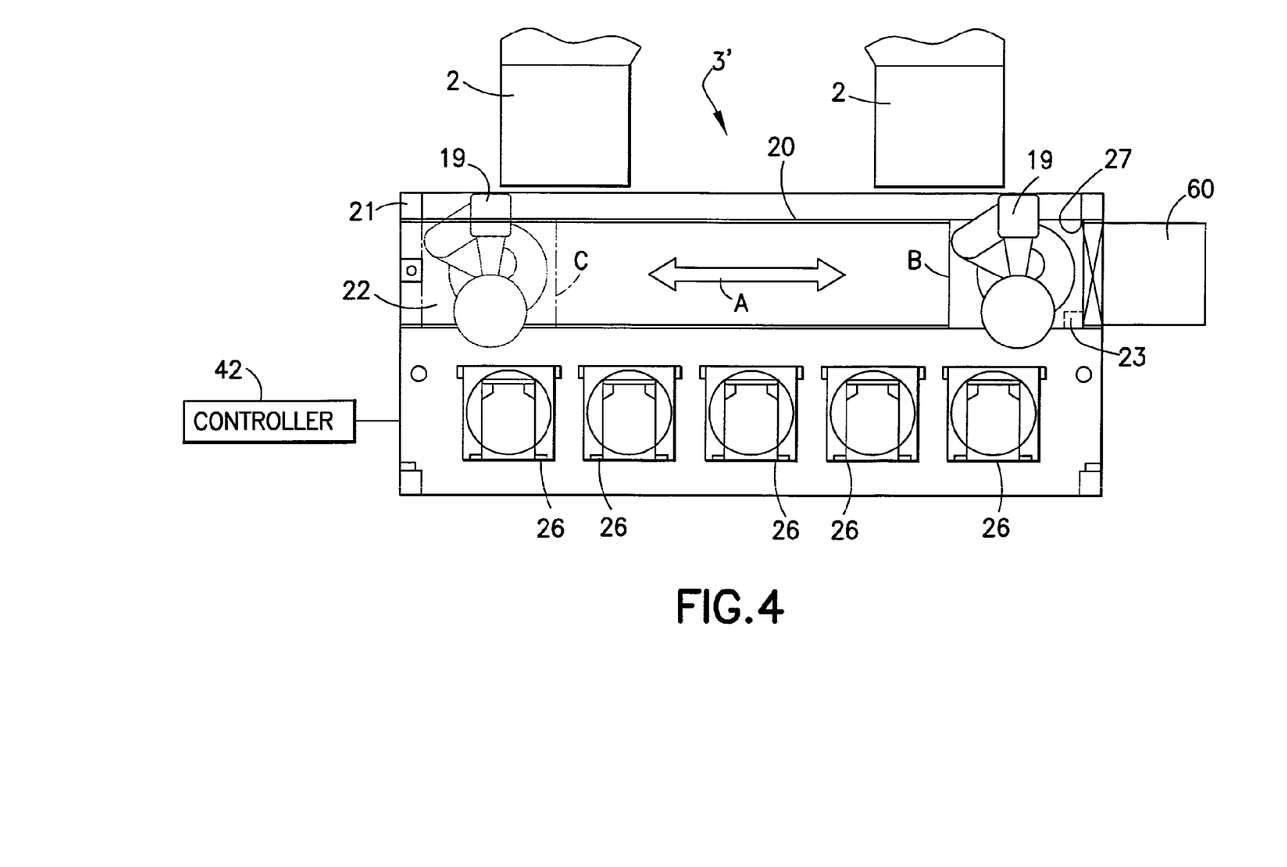
FIG. 4 is a schematic illustration of a front end loader adapted for use according to this invention.

Each of the workstations 50a and 50b may include multiple processing modules 4. In the embodiment shown in FIG. 2, the modules 4 are aligned side by side though in alternate embodiments the modules may be placed in any desired arrangement. Two modules 4 are shown for example, and the workstations may have more or fewer modules. Load locks 2 connect processing modules 4 with front end delivery systems or modules 3. Front end modules 3 may be equipped with door openers 15 and 16 which allow the docking of substrate holding containers 17 and 18 (such as FOUP's or SMIF's transport to the workstation by AMHS 107. The front end module 3 may incorporate a load port or other suitable structure (not shown) on which the cassettes 17, 18 are seated when docked to the module 3. Front end module 3 includes a robot 19 which may be fixed or mounted on a track 20 depending on the number of docking ports that it serves. A transport of this type is shown in FIG. 4 and is described in detail in commonly owned, U.S. Pat. No. 6,002,840, the disclosure of which is included in this application in its entirety. The transport robot 19 is shown in FIG. 4 as being a "scara" type robot, though in alternate embodiments any suitable robot may be used.

FIG. 4 illustrates another front end module 3' of a workstation system in accordance with another exemplary embodiment. The front module 3' in the embodiment is generally similar to module 3 shown in FIG. 1, except as otherwise noted.

Front end module 3', as shown in FIG. 4, generally comprises a frame 21, a car 22 mounted on a track 20, and a robot 19. In this embodiment, frame 21 is able to hold multiple substrate cassettes 26 (five cassettes are shown for example purposes). Front end module 3' is adapted to move substrates between the cassettes 26 and the load locks 2. Thus, Robot 19 is used to remove substrates (either individually or in multiples depending on the configuration of the robot end effector 19b) from the cassettes 26, and insert the substrates into the load locks 2. When the processing module 4 finishes processing the substrates, front end module 3' returns the substrates with robot 19 from the load locks 2 to the cassettes 26. In general, module 3, 3' operates in atmospheric pressure, but could be adapted for use in other pressure situations, including a vacuum. Nevertheless the front end module 3, 3' of the embodiment illustrated in FIGS. 2 and 4 may have a controlled environment. The frame 21 is adapted to removably support the cassettes 26 thereon. The cassettes 26 are well known in the art, such as cassettes that hold thirteen or twenty-six semiconductor wafers. The frame 21 is fixedly attached to the front ends of the load locks' 2. The car 22 is movably mounted on a track 20 on frame 21 to move or roll between positions B and C along pathway A. A car drive mechanism 23 drivingly connects the car 22 to the frame 21 to controllably move the car 22 to different positions along the track area 20.

Figure 3:
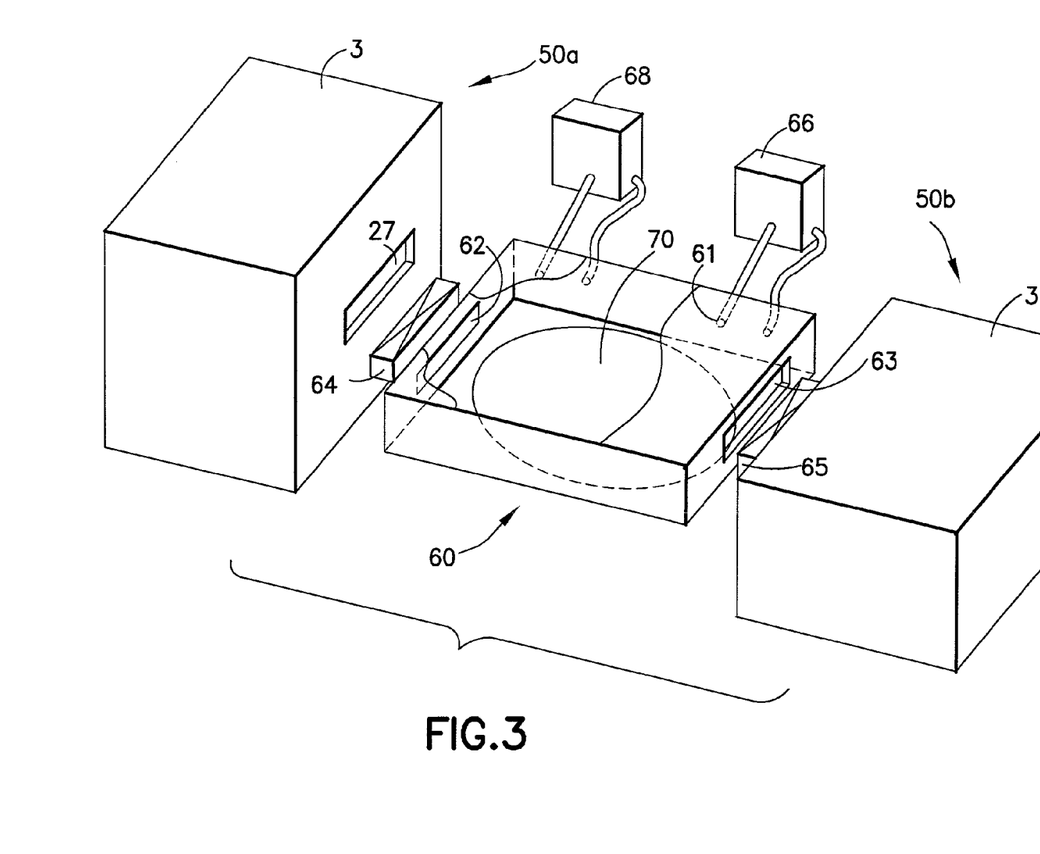
FIG. 3 is a perspective view of a bridging chamber configuration according to this invention.

Referring now also to FIG. 3 front end module 3 is constructed with an access port 27 which is used to connect module 3 of workstation 50a to workstation system 50b. In the embodiment shown in FIGS. 2-4 slit valves 64, 65 or any other suitable doors are located in the access ports 27 to isolate if desired the mini-environment in module 3 of workstations 50*a*, 50*b* from the adjoining workstation or bridging chamber 60. In alternate embodiments, the access ports 27 may not be closable. In position B (see FIG. 4) of the travel range of robot 19, robot 19 is adapted to extend through port 27 into bridging chamber 60. This extension of the robot 19 is used to deposit substrates from workstation system 50*a* into bridging chamber 60. A similar robot 19 is provided in the front end module 3 of workstation system 50*b* to extend into chamber 60 and pick up the substrate in transit and put the substrate into the processing cycle of workstation system 50*b*. Thus, as will be further described below, a bypass, relative to the automated material handling system 107 (see FIG. 2) is provided between workstation and 50*b*, 50*b* by chamber 60.

As noted before, front end modules 3, 3' of the workstation systems 50*a* and 50*b* are connected to processing modules 4 (see FIG. 2) that have a controlled atmosphere or vacuum via load locks 2. Each load lock 2 may be isolated and may be equipped with a processing port 6 and a delivery port 7 which are controlled respectively by slit valves 9 and 10. The valves are operated by a process control system 42. Port 7 allows access to the load lock 2 from front end delivery module 3. In this embodiment, the environment in the front end modules 3 or workstation systems 50*a*, 50*b* may be controlled with respect to ambient atmosphere as well as the corresponding processing modules, as discussed. Accordingly, in this embodiment the ports 27 of the front end module 3 to the bridging chamber may remain open and not be provided with a closable door or valve.

Workstation systems 50*a* and 50*b* are connected through bridging chamber 60 as shown in FIG. 3. Bridging chamber 60 may be enclosed within a housing 61 and constructed with access ports 62 and 63. Although in this embodiment housing 61 is shown as an independent module, in alternate embodiments the bridging chamber may be incorporated into the frame of either adjoining front end modules. A buffer platform 70 is constructed within chamber 60 to receive substrates in transit from workstation system 50*a* to workstation system 50*b*. Similar to ports 27 on module 3, ports 62 and 63 in housing 61 may be left open or if desired may be controlled by slit valves 64 and 65. If desired the atmosphere within chamber 60 may be isolated by operation of valves 64 and 65 and may be adjusted to predetermined parameters, for example, pressure and temperature, by an atmospheric control module 66. The atmosphere within chamber 60 would be sequentially adjusted in cooperation with slit valves 64 and 65 to match the conditions within the adjoining workstation systems, in a manner similar to a load lock. Valve operation and other functions of chamber 60 are executed by a process control module 67.

In the embodiment shown in FIG. 3, chamber 60 is equipped with metrology instrumentation 68 to enable the measurement and testing of substrates as they are passed through chamber 60. The metrology instrumentation may include any suitable sensors, detectors, or gages capable of detecting desired characteristics of the substrate held in the chamber. In addition an alignment control 69 could also be incorporated into chamber 60 to perform positional alignment of substrates for further processing or measurement. The aligner may include as alignment sensor (not shown) a rotatable chuck for holding and positioning a substrate. These two functions conventionally involve separate operations at an alignment or metrology station that demands additional transport. In the exemplary embodiment, these functions could be performed in an efficient manner when using the bypass provided by chamber 60 for the inter workstation system transport of substrates.

The workstation systems may be simple assemblies of process chambers, load lock and front end loader wherein the front end loader is a passive device which relies on the transport mechanism of the load lock or other element of the assembly. In an alternate embodiment, it is possible to construct an appropriate robot mechanism within the bridging chamber to enter the front end loader or other access port constructed in a workstation system and extract a substrate into the bridging chamber for transport into the adjacent workstation system. As may be realized, in this embodiment the robot of the bridging chamber may be used by a controller of the bridging chamber on information that no other transport mechanism is available or where available transport mechanisms of the workstation systems need not be utilized.

Figure 5:
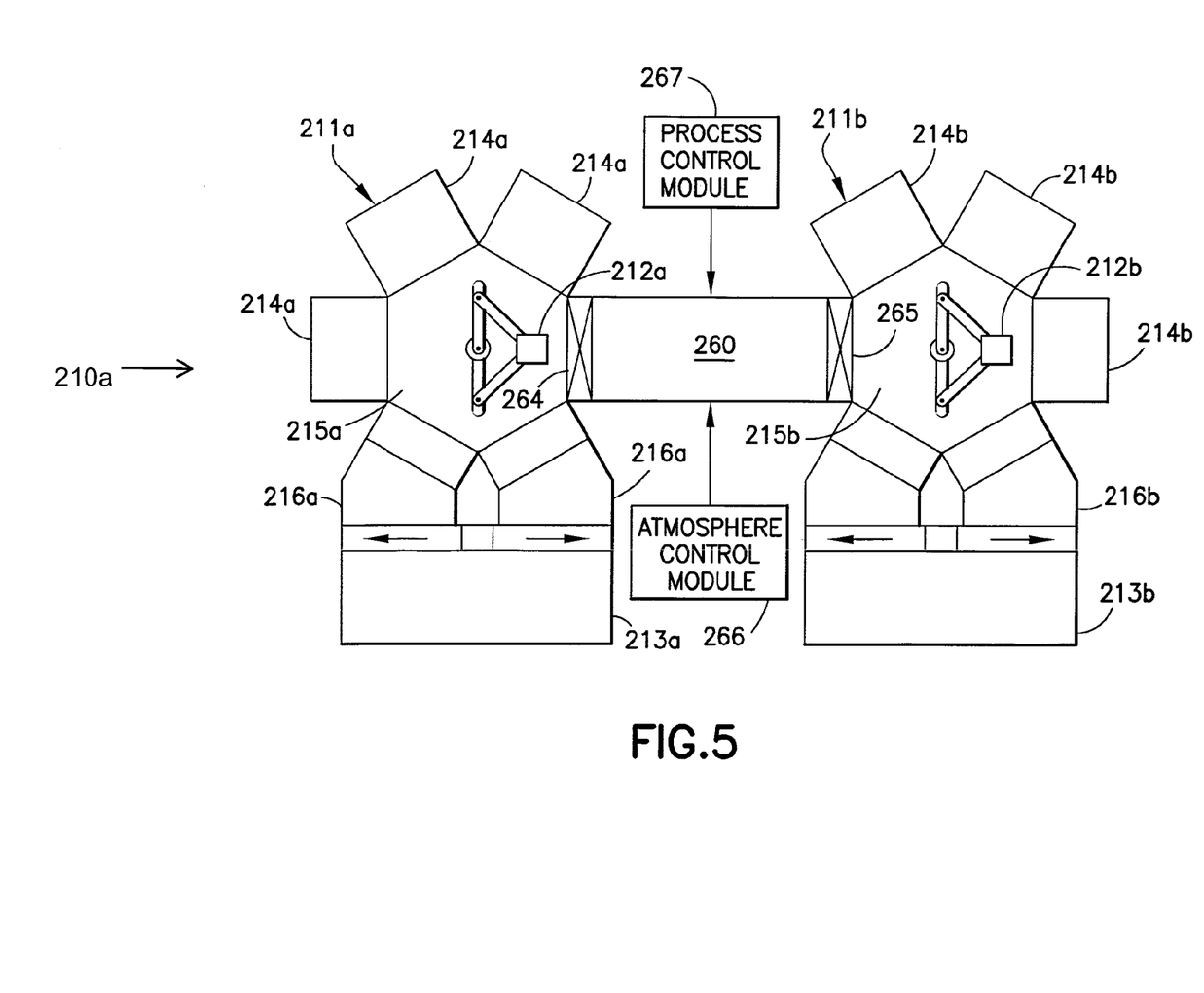
FIG. 5 is a schematic illustration of a of a pair of adjacent workstation systems with batch type processing chambers, connected by a bridging chamber according to a alternate embodiment of this invention.

An apparatus 210*a*, in accordance with another exemplary embodiment, is shown schematically in FIG. 5 generally comprising a pair of adjacent batch processing workstation systems 250*a* and 250*b* connected by bridging chamber 260. Each batch processing workstation systems generally comprises a substrate treatment section 211 and a substrate loading section 213 (loading section may be similar to front end module 3 described before). The treatment section 211 generally comprises a robot arm transport mechanism 212 mounted in transport chamber 215. Substrate processing modules 214 are connected to transport chamber 215, as are load locks 216. The treatment section 211 may be any one of a number of substrate treatment sections such as material deposition, etching, bathing or may be a combination of a number of sections. Attached to the front end of the load locks 216 is the front end loading section 213.

As seen in FIG. 5, the workstation systems 250*a* and 250*b* are interconnected by a bypass forming bridging chamber 260, that may be substantially similar to chamber 60 described before with reference to FIG. 3. As shown in FIG. 5, the workstation systems are connected through access ports in the transport chamber 217 in a manner that allows the transport robot arm 212 to extend into the chamber 260 to drop off a processed substrate from treatment section 211. It should be noted that the bridging chamber 260 could also be connected through the front end loader 213 using a front end loader mechanism as shown in FIG. 4. If desired an appropriate atmospheric cycling can be accomplished through operation, using process control module 267, of slit valves 264 and 265 in cooperation with the atmospheric control module 266 during the transfer.

Figure 6:
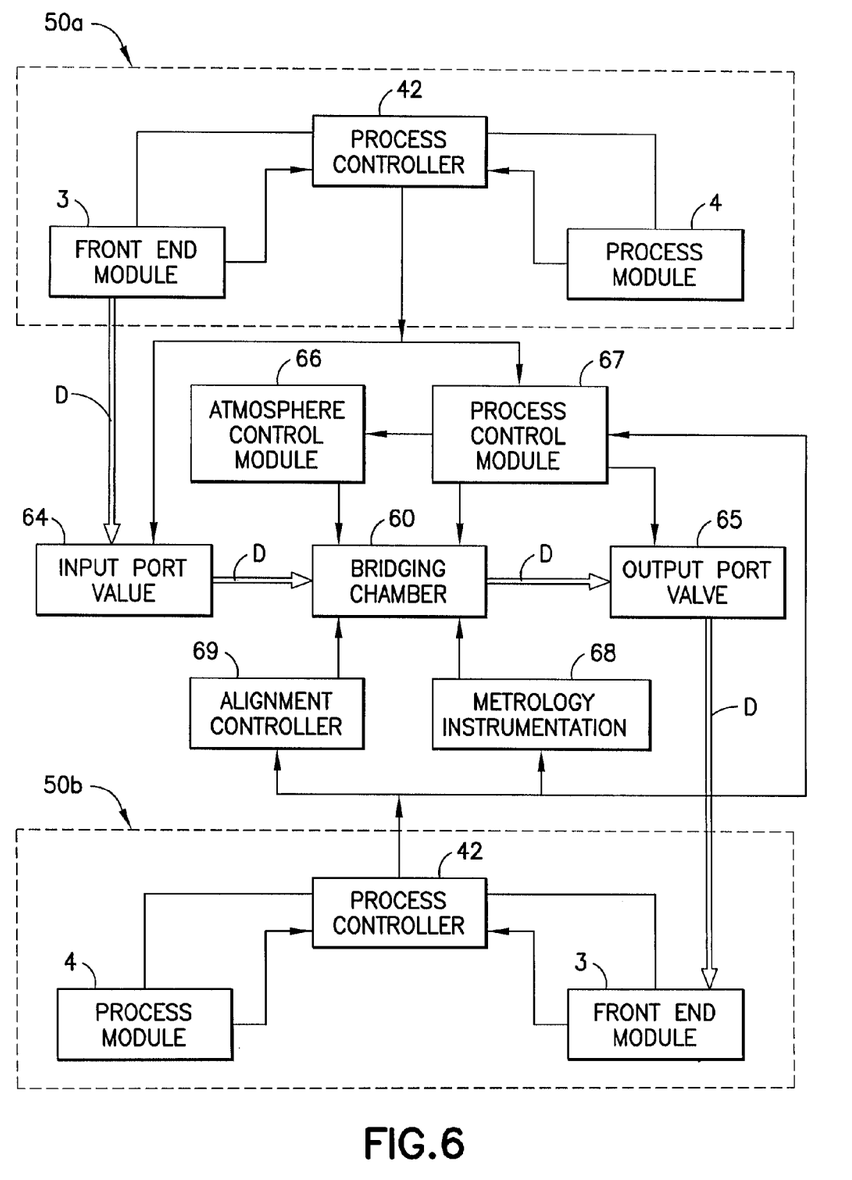
FIG. 6 is a schematic block diagram of the transport system of this invention.

The general operation of the bridging chamber system is illustrated in the schematic block diagram of FIG. 6. As shown therein, a substrate is moved through the system along the path D from the front end module 3 of workstation system 50*a*, into chamber 60, and to the front end loader 3 of workstation system 50*b*. The functional steps of this movement depends on the relative atmospheric conditions of the workstation systems, but could involve appropriate alternate opening and closing of the valves 64 and 65, as shown in FIG. 2, to balance the atmosphere of the bridging chamber 60 as a substrate is passed from one workstation system to the other, similarly to the operation of load lock. The immediate functions of bridging chamber 60 are performed by process control module 67. As these functions proceed they are coordinated with the operation of each workstation system through the process controllers 42 of the workstation systems.

In the embodiment, shown in FIG. 5, atmospheric balancing is likely, since transport chamber 217 generally operates continually at vacuum. This is accomplished by the use of slit valves 264 and 265 under the control of atmospheric control module 266 and process control module 267. In an alternate embodiment, the substrate will be aligned, accurately registered in position, and measured as it pauses in the bridging chamber 260. The immediate-functions of bridging chamber 260 are performed by process control module 267. As these functions proceed they are coordinated with the operation of each workstation system through the process controllers 242 of the workstation systems.

In particular in the embodiment of FIG. 5, the bypass feature becomes readily understood. Bridging chamber 260 provides a means by which substrates may be transferred directly from the transport chamber 215 of processing system 211a to that of processing system 211b while bypassing the normal operational path through load locks 216 and front end loaders 213, thereby shunting a considerable portion of the transfer process of the prior art.

In this manner a means is provided for conveniently transporting substrates between adjacent workstation systems using a simple transport mechanism while performing intermediate tasks, such as alignment and metrology metering in an efficient manner.

It should be understood that the foregoing description is only illustrative of the invention. Various alternatives and modifications can be devised by those skilled in the art, without departing from the present invention. Accordingly, the present invention is intended to embrace all such alternatives, modifications and variances which fall within the scope of the appended claims.

The invention claimed is:

1. In a semiconductor fabrication facility having at least a first workstation system and a second workstation system connected by means of a primary substrate handling system, the improvement comprising:
   the first workstation and second workstation systems being connected by a secondary transport system comprising a bridging chamber communicating with the at least first and second workstation systems, constructed to admit at least one substrate there through,
   wherein the primary substrate handling system is an automated material handling system configured to transport substrates in cassettes and forms a first transport path that is a primary path for moving substrates between the first workstation and second workstation systems and the bridging chamber is linked to the primary substrate handling system and forms a bypass transport path to the primary transport path of the primary substrate handling system, and
   a controller connected to the secondary transport system, the controller being configured to create the bypass transport path where the bypass transport path is created and configured to transport substrates on information that the primary transport path is unavailable.

2. The fabrication facility, according to claim 1, further comprising:
   a first transport mechanism constructed in the first workstation system for transporting at least one substrate within the first workstation system,
   a second transport mechanism constructed in the second workstation system for transporting the at least one substrate within the second workstation; and
   wherein the first transport mechanism is adapted to transfer the at least one substrate from the first workstation system to the bridging chamber and the second transport mechanism is adapted to transfer the at least one substrate from the bridging chamber into the second workstation system.

3. The fabrication facility, according to claim 2, wherein the first transport mechanism forms part of a front end loading system of the first workstation system.

4. The fabrication facility, according to claim 2, wherein the second transport mechanism forms part of a front end loading system of the second workstation system.

5. The fabrication facility, according to claim 2, wherein the first workstation system is a batch processing system having multiple process chambers communicating with a common transport chamber, and wherein the first transport mechanism comprises a transport robot housed in the common transport chamber.

6. The fabrication facility, according to claim 2, wherein the second workstation system is a batch processing system having multiple process chambers communicating with a common transport chamber, and wherein the second transport mechanism comprises a transport robot housed in the common transport chamber.

7. The fabrication facility, according to claim 1, wherein the bridging chamber further comprises metrology instrumentation for measuring characteristics of the at least one substrate in the bridging chamber.

8. The fabrication facility, according to claim 1, wherein the bridging chamber further comprises alignment apparatus for registering the at least one substrate in a predetermined position.

9. The fabrication facility, according to claim 1, wherein the bridging chamber further comprises valves operative to open and close receiving and dispensing ports linking the bridging chamber with the first workstation and second workstation systems according to a predetermined cycle to isolate the atmosphere within the bridging chamber.

10. The fabrication facility, according to claim 1, wherein the bridging chamber further comprises an atmosphere control system for controlling the atmosphere of the bridging chamber to form a transfer lock between the first and second workstation systems.

11. The fabrication facility, according to claim 1, wherein said at least first and second workstation systems are batch processing systems each having multiple process chambers communicating with a common transport chamber, and wherein the bridging chamber has a receiving port that is connected to an output port constructed in the transport chamber of the first workstation system, and has a dispensing port that is connected to an input port constructed in the transport chamber of the second workstation system.

12. The fabrication facility, according to claim 1, wherein the controller is configured to coordinate operations of the bridging station with operations of the primary substrate handling system when the first transport path is unavailable.

13. A semiconductor fabrication facility comprising:
   at least a first workstation and second workstation systems each having input/output stations for loading and unloading a respective one of the workstation systems;
   a first substrate handling system where the first substrate handling system is an automated material handling system configured to move substrates in cassettes through the fabrication facility along a first substrate transport path and to provide substrates to the input/output stations of the first workstation and the second workstation systems, the first substrate path being a primary substrate transport path; and
   a bypass system, linked to the first substrate handling system, coupling the at least first workstation and second workstation systems, the bypass system including a controller configured to create a second substrate transport path through the coupling of the at least first and second workstation systems, that is separate from the primary substrate transport path between at least the first workstation and second workstation systems, on information that the primary substrate transport path is unavailable.

\* \* \* \* \*